United States Patent [19]

Forgò et al.

[11] Patent Number: 4,666,954
[45] Date of Patent: May 19, 1987

[54] PROCESS FOR THE PREPARATION OF PREPREGS, AND THE REINFORCED COMPOSITE MATERIALS WHICH CAN BE OBTAINED THEREWITH

[75] Inventors: Imre Forgò ; Elvio Manso, both of Birsfelden; Urs Gruber, Arlesheim; René Huwyler, Aesch, all of Switzerland

[73] Assignee: Ciba-Geigy Corporation, Ardsley, N.Y.

[21] Appl. No.: 642,909

[22] Filed: Aug. 21, 1984

[30] Foreign Application Priority Data

Aug. 24, 1983 [CH] Switzerland ............ 4615/83

[51] Int. Cl.$^4$ ............ C08F 2/50; C08F 20/20; C08L 63/10; C08G 59/50
[52] U.S. Cl. ............ 522/83; 522/71; 522/81; 522/103; 522/142; 522/143; 522/144; 522/170; 156/273.3
[58] Field of Search ............ 204/159.11, 159.23, 204/159.24; 522/31; 522/83, 103, 142, 170

[56] References Cited

U.S. PATENT DOCUMENTS

| | | | |
|---|---|---|---|
| 3,703,434 | 11/1972 | Schaaf | 428/349 |
| 3,776,729 | 12/1973 | Levy | 204/159.15 |
| 3,956,043 | 6/1976 | Zahir | 430/319 |
| 4,092,443 | 5/1978 | Green | 204/159.23 |
| 4,182,832 | 1/1980 | Zondler | 528/103 |
| 4,193,905 | 3/1980 | Audykowski | 528/88 |
| 4,201,854 | 5/1980 | Zondler | 528/121 |
| 4,252,592 | 2/1981 | Green | 156/272 |
| 4,252,593 | 2/1981 | Green | 204/159.23 |
| 4,287,106 | 9/1981 | Forgo | 524/104 |
| 4,299,938 | 11/1981 | Green | 526/192 |
| 4,358,477 | 11/1982 | Noomen et al. | |
| 4,410,680 | 10/1983 | Brownscombe et al. | 528/88 |

FOREIGN PATENT DOCUMENTS

1386122 3/1975 United Kingdom .
2029433 3/1980 United Kingdom .
1570992 9/1980 United Kingdom .

OTHER PUBLICATIONS

Chem. Abstracts, 86: 6455z (1977), Komakine.

*Primary Examiner*—John C. Bleutge
*Assistant Examiner*—Arthur H. Koeckert
*Attorney, Agent, or Firm*—Harry Falber

[57] ABSTRACT

Prepregs which are tacky to dry to the touch can be prepared by impregnating a solid reinforcing material with a liquid, solvent-free composition containing (a) an epoxide resin, (b) a photopolymerizable compound, (c) a heat-activatable curing agent for the epoxide resin (a) and, if appropriate, a photopolymerization catalyst for the photopolymerizable compound (b), and the composition is exposed to actinic radiation. The composition solidifies thereby to give an essentially solid layer as the result of photopolymerization of the photopolymerizable compound, whereas the epoxide resin remains substantially in a heat-curable state. In accordance with the invention, a substituted or unsubstituted aliphatic, cycloaliphatic or araliphatic amine is used as the heat-activatable curing agent (c), and the photopolymerizable compound (b) is employed in such a ratio to the heat-curable component (a) that, after irradiation with actinic light, the composition can still be shaped by thermoplastic methods. The prepregs thus obtained are suitable for the production of reinforced composite materials, such as skis, tennis rackets or car body components by hot-curing.

12 Claims, No Drawings

PROCESS FOR THE PREPARATION OF PREPREGS, AND THE REINFORCED COMPOSITE MATERIALS WHICH CAN BE OBTAINED THEREWITH

The present invention relates to a process for the preparation of prepregs and to the reinforced composite materials which can be obtained therewith by hot curing.

Prepregs, stable on storage, for the preparation of fibre-reinforced composite materials can be prepared, for example, by impregnating reinforcing material in the form of fibre with a composition containing an epoxide compound, a photopolymerisable compound, a heat-activatable curing agent for the epoxide resin and, if appropriate, a photopolymerisation catalyst, and exposing the impregnated material to actinic radiation in such a way that the composition solidifies as a result of photopolymerisation of the photopolymerisable compound, whereas the epoxide resin remains essentially in a heat-curable state. The curing agents used for the epoxide resin here are relatively few active compounds, so-called "latent" curing agents, such as polycarboxylic anhydrides, dicyandiamide, complexes of, preferably tertiary, amines, with $BF_3$ or $BCl_3$, aromatic polyamines or imidazoles (cf. German Offenlegungsschriften No. 2,706,549 and 2,706,638). British Patent Specification No. 1,386,122 describes light-sensitive coating materials for the selective production of dielectric layers containing at least one polyfunctional, photopolymerisable vinyl monomer, a photosensitisor for the photopolymerisation of the vinyl monomer under actinic irradiation, a partially cured, crosslinkable polymer, for example an epoxide resin which has been cured to the B-stage, and a heat-activatable curing agent for the partially cured polymer. Curing agents which are known per se can be employed in this process, but aromatic and aliphatic amine curing agents have proved unsuitable owing to interfering side reactions with the preferred vinyl monomers. Anhydrides and dicyandiamides are preferred as curing agents.

For certain applications, in particular in cases where prepregs are produced industrially and are processed further, it is not necessary to have such a long shelf life as can normally be achieved using the latent curing agents mentioned above, in particular dicyandiamide. On the other hand, fairly short curing times at low temperatures, preferably at temperatures below 120° C., are desirable in such applications. Shortened curing times at low temperatures can be achieved in customary epoxide resin/curing agent systems by using rapidly curing reactive aliphatic or alicyclic amines, in some circumstances even without the addition of accelerators. In the course of this, however, the pot life and the working life of such resin/curing agent systems is considerably shortened as the reactivity of the amine curing agents increases. These systems are, therefore, unsuitable, for example, for the preparation of prepregs, because the resin/curing agent mixture solidifies within a few hours even at room temperature.

The object of the invention was, therefore, to provide a process by which it is possible to prepare prepregs having shortened reaction times at low temperatures, while avoiding the disadvantages mentioned above.

Accordingly, the invention relates to a novel process for the preparation of prepregs by impregnating a reinforcing material with a liquid, solvent-free composition containing (a) an epoxide resin, (b) a photopolymerisable compound, (c) a heat-activatable curing agent for the epoxide resin (a) and, if appropriate, (d) a photopolymerisation catalyst for the photopolymerisable compound (b), and exposing the composition to actinic radiation until the composition solidifies, as a result of photopolymerisation of the photopolymerisable compound, to give a substantially solid layer, whereas the epoxide resin remains substantially in a heat-curable state, the heat-activatable curing agent (c) being a substituted or unsubstituted aliphatic, cycloaliphatic or araliphatic amine and the photopolymerisable compound (b) being employed in such a ratio to the heat-curable component (a) that, after irradiation with actinic light, the composition, i.e. the prepreg, can still be shaped under thermoplastic conditions.

The process according to the invention makes it possible to prepare prepregs which are tacky to dry to the touch and which only require short curing times at relatively low temperatures. The liquid, solvent-free resin/curing agent mixture used here has a surprisingly long working life and long pot lives. By virtue of the short curing times, it is also possible to reduce considerably the cycle times or mould dwell times in the production of various composite articles, for example skis, tennis rackets, car body components and casings. The prepregs which have been pre-reacted by means of actinic radiation in accordance with the invention are distinguished, additionally, by a so-called slowed flow when compressed in the heated press, i.e. the viscosity of the system is diminished by only a relatively small amount at the increase in temperature required for thermal curing. This has the advantage that the resin does not exude from the reinforcing material or does so to only a trifling extent. Consequently the risk of so-called lean areas occurring, i.e. areas without resin, is low. There is also less contamination of the press tools and of the press. It is a further substantial advantage from the economic and ecological aspects that it is possible to dispense with the use of solvents in the process according to the invention.

The invention also relates to the prepregs prepared by the process according to the invention and to their use for the production of reinforced composite materials by subjecting the prepregs to hot curing.

The reinforcing material can, for example, be in the form of woven or nonwoven layers, unidirectional or cut strands and can consist of natural or synthetic fibres, particularly glass, boron, stainless steel, tungsten, silicon carbide, asbestos, carbon or aromatic polyamide fibres, such as poly-(m-phenyleneisophthalamide) or poly-(p-phenyleneterephthalimide) fibers. Glass fibres are particularly preferred as the reinforcing material.

The substituted or unsubstituted aliphatic, cycloaliphatic or araliphatic (poly)amines which can be used in accordance with the invention are preferably compounds having at least two amino groups, at least one of which is a primary or secondary amino group. Examples of suitable substituents in amines of this type are CN groups, alkyl and aminoalkyl groups having 1–12 and especially 1–4 C atoms, particularly methyl, ethyl, aminomethyl, 2-aminoethyl and 3-aminopropyl groups, $C_{5-8}$-cycloalkyl, $C_{7-8}$-aralkyl, phenyl, $C_{1-4}$-alkylphenyl, $C_{1-4}$-alkoxy phenyl, halogenophenyl and hydroxyphenyl groups, such as methylphenyl, ethylphenyl, isopropylphenyl, methoxyphenyl, ethoxyphenyl, chlorophenyl and dichlorophenyl groups, —$(CH_2)_s$—(s=2-8) groups, $C_{2-8}$-alkylidene groups and $C_{5-8}$-cycloalkylidene groups, and 5-membered or 6-membered heterocyclic radicals, such as furyl, tetrahydrofuryl, thienyl, piperidyl and piperazinyl groups.

Aliphatic amines can be linear or branched and can be substituted or unsubstituted. The following are examples of suitable amines:

1. Diprimary alkylenediamines which have at least two and preferably 2-14 C atoms and which can be interrupted in the chain by NH or O atoms, such as ethylenediamine, 1,2-propylenediamine, 1,3-propylenediamine, tetramethylenediamine, pentaethylenediamine, hexamethylenediamine or octamethylenediamine; polyethylenediamines of the formula $H_2N—CH_2CH_2—(NH—CH_2CH_2)_b—NH_2$ in which b is an integer from 1 to 6, such as diethylenetriamine, triethylenetetramine and tetraethylenepentamine; polyoxyethylenediamine, polyoxypropylenediamine, 3-(2-aminoethyl)-aminopropylamine, 1,2-bis-(3-aminopropylamino)-ethane and N,N'-bis-(3-aminopropyl)-1,4-diaminobutane.

2. Amines of the formulae I to V

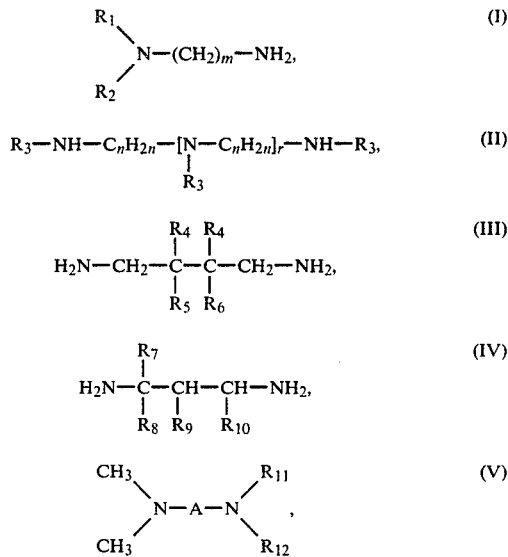

in which m is an integer from 2 to 6, especially 2 or 3, n is an integer from 2 to 12, especially 3 to 6, r is zero, 1 or 2, $R_1$ is hydrogen, $C_{1-4}$-alkyl, especially methyl or ethyl, $R_2$ is $C_{1-4}$-alkyl, especially methyl or ethyl, cyclopentyl or cyclohexyl, the $R_3$s are each cyclopentyl, cyclohexyl, benzyl or phenylethyl, $R_3'$ is the same as $R_3$ or is hydrogen, the $R_4$s independently of one another are hydrogen or methyl, $R_5$ is phenyl, chlorophenyl or isopropylphenyl, $R_6$ is phenyl, chlorophenyl or methoxyphenyl, $R_7$ and $R_9$ independently of one another are hydrogen or $C_{1-4}$-alkyl, $R_8$ is phenyl or a 5-membered or 6-membered heterocyclic radical and $R_{10}$ is hydrogen, $C_{1-4}$-alkyl, phenyl or a 5-membered or 6-membered heterocyclic radical or $R_7$ and $R_8$ and/or $R_9$ and $R_{10}$ together are —$(CH_2)_q$— in which q is 4 or 5, $R_{11}$ is $C_{1-12}$-alkyl, especially $C_{1-8}$-alkyl and, in particular, $C_{1-4}$-alkyl, $C_{6-8}$-cycloalkyl, $C_{7-8}$-aralkyl, —$A_1$—CN or —$A_2$—$CH_2NH_2$ and $R_{12}$ is hydrogen or —$A_2CH_2NH_2$ and A, $A_1$ and $A_2$ independently of one another are ethylene, 1,2-propylene or 1,3-propylene. A is preferably 1,3-propylene and $A_1$ and $A_2$ are preferably ethylene. Suitable 5-membered or 6-membered heterocyclic radicals $R_8$ and $R_{10}$ are, in particular, tetrahydrofuryl or pyridyl groups.

3. Aliphatic polyaminoamides, such as the products known by the trade names Versamid ® 115 and Versamid ® 125 or similar reaction products formed from aliphatic amines and fatty acids, especially dimerised or trimerised fatty acids.

4. Cycloaliphatic amines, in which the ring can also contain hetero-atoms, especially N atoms, for example 1,2-diaminocyclopentane, 1,3-diaminocyclopentane, 1,2-, 1,3- or 1,4-diaminocyclohexane, 3,3'-, 3,4'- or 4,4'-diaminodicyclohexylmethane, 4,4'-diamino-3,3'-dimethyldicyclohexylmethane, isophoronediamine, N-aminoethylpiperazine, N,N'-bis-(3-aminopropyl)-piperazine, N-aminomethylpiperidine, 1,3-(aminomethyl)-cyclohexane, 1,4-(aminomethyl)-cyclohexane and 3(4), 8(9)-bisaminomethyltricyclo[5.2.1.0$^{2.6}$]decane.

5. Examples of suitable araliphatic amines are 1,3-xylylenediamine and 1,4-xylylenediamine.

6. Adducts of amines of the type mentioned above, such as ethylenediamine, hexamethylenediamine, diethylenetriamine, triethylenetriamine, tetraethylenepentamine, 1,2-diaminocyclohexane, 1,3-diaminocyclohexane or isophorone diamine, with acrylonitrile, ethylene oxide, propylene oxide or polyepoxides.

It is also possible to employ mixtures of different amines. The said amines are known or can be prepared by processes known per se [cf., for example, U.S. Pat. Nos. 4,182,832, 4,193,905 and 4,201,854].

Preferred compounds of the formula I are those in which m is the number 2 or 3, $R_1$ is hydrogen, methyl or ethyl and $R_2$ is methyl, ethyl or cyclohexyl.

The most preferred compounds of the formula II are those in which the $R_3$s are each cyclohexyl or benzyl, $R_3'$ is hydrogen, cyclohexyl or benzyl and the group —$C_nH_{2n}$—, is —$(CH_2)_n$— in which n=3 to 6 and r is as defined above.

Preferred compounds of the formula III are 1,4-diamino-2,3-diphenylbutane and 1,4-diamino-2,3-dimethyl-2,3-diphenylbutane.

The most preferred compounds of the formula IV are those in which: $R_7$ and $R_8$ are hydrogen, $R_8$ is phenyl and $R_{10}$ is hydrogen, methyl, tert.-butyl, phenyl, tetrahydrofuryl or pyridyl; $R_7$ is hydrogen, $R_8$ and $R_{10}$ are phenyl and $R_9$ is methyl; $R_7$ is hydrogen, $R_8$ is methyl or phenyl and $R_9$ and $R_{10}$ together are tetramethylene; $R_7$ ad $R_8$ together are pentamethylene and $R_9$ and $R_{10}$ together are tetramethylene; and $R_7$ is methyl, $R_8$ and $R_{10}$ are phenyl and $R_9$ is hydrogen.

Examples of particularly suitable compounds of the formula IV are 1,3-diamino-1,3-diphenylpropane, 1,3-diamino-1-phenyl-3-(2-tetrahydrofuryl)-propane and 1,3-diamino-1,3-diphenyl-2-methylpropane.

In formula V, $R_{12}$ is preferably a hydrogen atom and $R_{11}$ is ethyl, n-propyl, isopropyl, n-butyl, isobutyl, cyclopentyl, cyclohexyl, 2-cyanoethyl or 3-aminopropyl. Compounds of the formula V which are also preferred are those in which $R_{11}$ is 2-cyanoethyl or 3-aminopropyl and $R_{12}$ is 3-aminopropyl. Compounds of the formula V which are particularly preferred are those in which A is ethylene and, in particular, 1,3-propylene, $R_{12}$ is hydrogen and $R_{11}$ is 2-cyanoethyl or 3-aminopropyl.

The following are some examples of compounds of the formula V: N,N-dimethyl-N'-(2-cyanoethyl)-ethylenediamine, N,N-dimethyl-N'-(3-aminopropyl)-ethylenediamine, N,N-dimethyl-N',N'-di-(3-aminopropyl)-ethylenediamine, N,N-dimethyl-N'-(2-cyanoethyl)-1,3-diaminopropane, N,N-dimethyl-N'-(3-aminopropyl)-1,3-diaminopropane and N,N-dimethyl-N',N'-di-(3-aminopropyl)-1,3-diaminopropane.

Amines which are used particularly preferentially are tetramethylenediamine, hexamethylenediamine, polyethylenediamines H$_2$N—CH$_2$CH$_2$—(NH—CH$_2$CH$_2$)$_b$—NH$_2$ in which b is 1-6, especially 1-4, 1,2-diaminocyclohexane, 1,3-bis-(aminomethyl)-cyclohexane, 1,4-bis-(aminomethyl)-cyclohexane, 4,4'-diaminodicyclohexylmethane, 1,3-xylylenediamine, 1,4-xylylenediamine, 1,3-diamino-1,3-diphenylpropane, 1,3-diamino-1-phenyl-3-(2-tetrahydrofuryl)-propane, N-ethylaminopiperazine, 3-aminomethyl-3,5,5-trimethylcyclohexylamine(isophoronediamine), N,N-dimethyl-1,3-diaminopropane, N,N-diethyl-1,3-diaminopropane, N,N-dimethyl-N'-(3-aminopropyl)-1,3-diaminopropane and N,N-dimethyl-N'-(2-cyanoethyl)-1,3-diaminopropane or mixtures thereof.

Isophoronediamine or mixtures of N,N-dimethyl-N'-(3-aminopropyl)-1,3-diaminopropane and N,N-dimethyl-N'-(2-cyanoethyl)-1,3-diaminopropane are very particularly preferred.

Curing agents (c) containing only primary and/or secondary amino groups are advantageously used in an amount of 0.8 to 1.2 amine hydrogen equivalents, especially about 1 amine hydrogen equivalent, per epoxide equivalent. If the amine curing agent (c) also contains tertiary amino groups, the amount of amine hydrogen equivalents per epoxide equivalent required for curing the epoxide resins (a) can be reduced to about 0.2, preferably 0.25 to 0.5.

The epoxide resins (a), photopolymerisable compounds (b) and, if appropriate, photopolymerisation catalysts (d) which are employed can be compounds known per se, such as are described, for example, in German Offenlegungsschrift No. 2,706,549.

Suitable epoxide resins, i.e. substances having more than one epoxide group per average molecule, are preferably resins which contain groups of the formula A

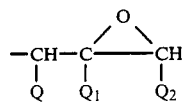

attached to carbon, oxygen, nitrogen or sulfur atoms, and which are free from acryloyl or methacryloyl groups, Q and Q$_2$ each being a hydrogen atom and Q$_1$ being a hydrogen atom or the methyl group or Q and Q$_2$ together being —CH$_2$CH$_2$— or —CH$_2$CH$_2$CH$_2$— and Q$_1$ being a hydrogen atom.

Examples of such resins which may be mentioned are polyglycidyl and poly-(β-methylglycidyl)esters which are obtained by reacting a compound containing two or more carboxyl groups per molecule with epichlorohydrin, glycerol dichlorohydrin or β-methylepichlorohydrin in an alkaline medium. Polyglycidyl esters of this type can be derived from aliphatic, cycloaliphatic or aromatic polycarboxylic acids. Examples of suitable polycarboxylic acids are succinic acid, glutaric acid, adipic acid, pimelic acid, suberic acid, azelaic acid, sebacic acid, dimerised or trimerised linoleic acid, tetrahydrophthalic acid, 4-methyltetrahydrophthalic acid, hexahydrophthalic acid, 4-methylhexahydrophthalic acid, phthalic acid, isophthalic acid and terephthalic acid.

Further examples are polyglycidyl and poly-(β-methylglycidyl)ethers which are obtained by reacting a compound containing at least two alcoholic and/or phenolic hydroxyl groups per molecule with epichlorohydrin or with allyl chloride, followed by epoxidisation with per-acids.

Examples of suitable polyols are ethylene glycol, diethylene glycol, poly-(oxyethylene)glycols, propane-1,2-diol, poly-(oxypropylene)glycols, propane-1,3-diol, butane-1,4-diol, poly-(oxytetramethylene)glycols, pentane-1,5-diol, hexane-2,4,6-triol, glycerol, 1,1,1-trimethylolpropane, pentaerythritol and sorbitol; resorcitol, quinitol, bis-(4-hydroxycyclohexyl)-methane, 2,2-bis-(4-hydroxycyclohexyl)-propane and 1,1-bis-(hydroxymethyl)-cyclohex-3-ene; N,N-bis-(2-hydroxyethyl)-aniline and p,p'-bis-(2-hydroxyethylamino)-diphenylmethane; resorcinol, hydroquinone, bis-(4-hydroxyphenyl)methane (bisphenol F), 4,4'-dihydroxybiphenyl, bis-(4-hydroxyphenyl)sulfone, 1,1,2,2-tetrakis-(4-hydroxyphenyl)-ethane, 2,2-bis-(4-hydroxyphenyl)-propane (bisphenol A) and 2,2-bis(3,5-dibromo-4-hydroxyphenyl)-propane (tetrabromo bisphenol A); and novolacs formed from formaldehyde or acetaldehyde with phenol, chlorophenol or alkylphenols having up to 9 C atoms in the alkyl group.

Suitable poly-(N-glycidyl)compounds are products obtained by dehydrochlorinating reaction products formed from epichlorohydrin and amines having at least two amino hydrogen atoms. Examples of suitable amines are aniline, n-butylamine, bis-(4-aminophenyl)-methane, 1,3-xylylenediamine, 1,4-xylylenediamine, 1,3-bis-(aminomethyl)-cyclohexane, 1,4-bis-(aminomethyl)-cyclohexane and bis-(4-methylaminophenyl)methane. Triglycidyl isocyanurate, N,N'-diglycidyl derivatives of cyclic alkyleneureas, such as ethyleneurea and 1,3-propyleneurea, or hydantoins, such as 5,5-dimethylhydantoin, are further suitable compounds of this type.

Examples of poly-(S-glycidyl)compounds are the di-S-glycidyl derivatives of dithiols, such as ethane-1,2-dithiol and bis-(4-mercaptomethylphenyl)ether.

Examples of epoxide resins having one or more groups of the formula A in which Q and Q$_2$ together are a group —CH$_2$CH$_2$— or —CH$_2$CH$_2$CH$_2$— are bis-(2,3-epoxycyclopentyl)ether, 2,3-epoxycyclopentyl glycidyl ether, 1,2-bis-(2,3-epoxycyclopentyloxy)-ethane, 3,4-epoxy-6-methylcyclohexylmethyl 3',4'-epoxy-6'-methylcyclohexanecarboxylate and 2-(3,4-epoxy)-cyclohexyl-5,5-spiro-(3',4'-epoxy)-cyclohexane-m-dioxane.

Resins which can also be employed are epoxide resins in which the epoxide groups are attached to heteroatoms of various kinds or in which some or all of the epoxide groups occupy a middle position, for example the N,N,O-triglycidyl derivative of 4-aminophenyl, N-glycidyl-N'-(2-glycidyloxypropyl)-5,5-dimethylhydantoin, vinylcyclohexene dioxide, limonene dioxide and dicyclopentadiene dioxide.

If desired, mixtures of epoxide resins can also be used.

It is preferable to employ, in the process according to the invention, diglycidyl ethers, which may be particularly advanced, of dihydric phenols, in particular 2,2-bis-(4-hydroxyphenyl)-propane, 2,2-bis-(3,5-dibromo-4-hydroxyphenyl)-propane and bis-(4-hydroxyphenyl)-methane, or of dihydric aliphatic alcohols having up to 8 C atoms, such as butane-1,4-diol, polyglycidyl ethers of novolacs or tetraglycidylated 4,4'-diaminodiphenylmethane. Diglycidyl ethers, which may be advanced, of bisphenol A, tetrabromobisphenol A or bisphenol F, tetraglycidylated 4,4'-diaminodiphenylmethane, polyglycidyl ethers of phenol-formaldehyde or cresol-formaldehyde novolacs or mixtures thereof are very particularly preferred.

Photopolymerisable compounds (b) which can be used are, for example—as already mentioned—compounds of the type described in German Offenlegungsschrift No. 2,706,549. Such compounds can be polymerised by a free-radical chain reaction or by the reaction of an activated monomer molecule with another monomer molecule.

Preferred photopolymerisable compounds, used in accordance with the invention, of the type first mentioned contain one or, if they are unconjugated, more than one ethylene bond. Acrylic esters having at least one group of the formula B $$CH_2=C(Q_3)COO-  \qquad (B),$$

in which $Q_3$ is a hydrogen, chlorine or bromine atom or a $C_{1-4}$-alkyl group, especially a hydrogen atom or a methyl group, are preferred. Further suitable compounds of this type are styrene, divinylbenzene, crotonic acid esters and sorbic acid esters.

Examples of suitable photopolymerisable substances of the second type are compounds having at least two, and preferably three or more, chalcone, propenone or pentadienone groups, and, in particular, acrylates which are substituted in the 3-position.

Examples of suitable 3-substituted acrylates are those containing groups of the formula C $$Q_4CH=C(Q_3)COO- \qquad (C),$$

in which $Q_4$ is an aliphatic or mononuclear, aromatic, araliphatic or heterocyclic group which is ethylenically or aromatically unsaturated in conjugation with the C=C double bond indicated, such as the phenyl, 2-furyl, 2-pyridyl, 3-pyridyl, prop-2-enyl or styryl group, and $Q_3$ is as defined above. Examples of compounds of such a kind are the sorbic acid diesters of poly-(oxyethylene)glycols and poly-(oxypropylene)glycols.

It is preferable to use, as the photopolymerisable compound (b), an acrylic acid ester of the formulae D, E, F or G

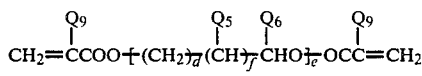  (D)

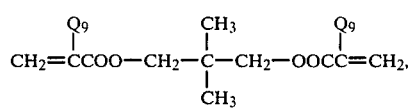  (E)

  (F)

or

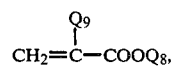  (G)

in which d is an integer from 1 to 8, e is an integer from 1 to 20, f is zero or 1, $Q_5$ is —H, —OH or —OOCC($Q_9$)=CH$_2$, $Q_6$ is —H, methyl, ethyl, —CH$_2$OH or —CH$_2$OOCC($Q_9$)=CH$_2$, $Q_7$ is methyl, ethyl, —CH$_2$OOCC($Q_9$)=CH$_2$ or —CH$_2$—OH, $Q_8$ is $C_{1-18}$-alkyl, especially $C_{1-8}$-alkyl, hydroxyalkyl having 1–6 C atoms, alkoxyalkyl having a total of 2–8 C atoms, especially 3–6 C atoms, a group

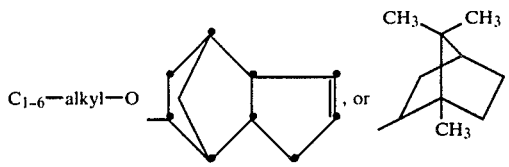

N,N-dialkylaminoalkyl having a total of 3–12, especially 3–6, C atoms,

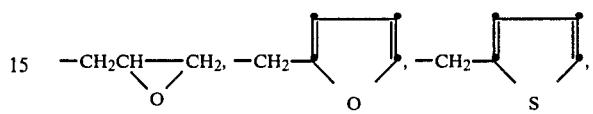

$C_{3-4}$-alkenyl, cyclopentyl or cyclohexyl and $Q_9$ is hydrogen or methyl.

The following are examples of compounds of the formula D: ethylene glycol diacrylate and dimethacrylate, 1,4-butanediol diacrylate and dimethacrylate, 1,6-hexanediol diacrylate and dimethacrylate and polyethylene glycol diacrylates and dimethacrylates having 2–20 ethylene glycol units (d=1, f=0, e=2–20 and $Q_6$=H), especially diethylene glycol diacrylate and dimethacrylate and triethylene glycol diacrylate and dimethacrylate. Suitable compounds of the formula E are neopentylglycol diacrylate and especially neopentylglycol dimethacrylate. Preferred compounds of the formula F are pentaerythritol tetraacrylate and tetramethacrylate and also 1,1,1-trimethylolpropane triacrylate and trimethacrylate.

Examples of suitable groups $Q_8$ according to the definition are methyl, ethyl, n-propyl, isopropyl, n-butyl, sec.butyl, n-pentyl, n-hexyl, 2-ethylhexyl, n-octyl, n-decyl, n-dodecyl, n-tetradecyl, n-heptadecyl, and n-octadecyl: hydroxymethyl, 2-hydroxyethyl, 3-hydroxypropyl, 2-hydroxypropyl and 4-hydroxybutyl; methoxymethyl, ethoxymethyl, 2-methoxyethyl, 2-ethoxyethyl and 2-n-butoxyethyl;

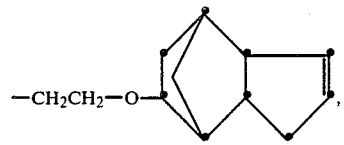

2-(dimethylamino)-ethyl, 2-(diethylamino)-ethyl, 3-(diethylamino)-propyl, 2-(di-n-propylamino)-ethyl and 2-(di-n-butylamino)-ethyl; and allyl, methallyl and 1-butenyl.

$Q_8$ is preferably $C_{1-8}$-alkyl, especially $C_{1-4}$-alkyl, $C_{2-3}$-hydroxyalkyl, 2-alkoxyethyl having 2–4 C atoms in the alkoxy group,

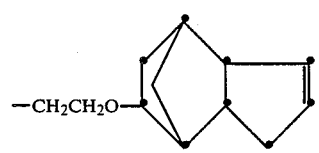

or 2-(dialkylamino)-ethyl having 1 or 2 C atoms in each of the alkyl groups.

$Q_9$ is preferably methyl. It is also possible to use mixtures of different photopolymerisable compounds (b).

The photopolymerisable compound (b) which is very particularly preferentially employed in the process according to the invention in ethylene glycol dimethacrylate, 1,4-butanediol dimethacrylate, 2-hydroxyethyl methacrylate, 3-hydroxypropyl methacrylate, 2-ethoxyethyl methacrylate, 1,1,1-trimethylolpropane trimethacrylate or a compound of the formula G in which $Q_8$ is

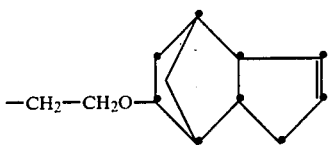

and $Q_9$ is methyl, or mixtures of the said compounds.

The epoxide resin (a) and the photopolymerisable compound (b) are advantageously used in a ratio by weight of 100:3 to 100:30, especially 100:6 to 100:20, or in an equivalence ratio of 1:0.01 to 1:0.7, preferably 1:0.08 to 1:0.3.

The liquid compositions used in the process according to the invention can also contain substances containing, per molecule, at least one epoxide group and at least one group which can be polymerised by means of actinic radiation (described in the following text as "doubly-functional substance"). Substances of this type can be prepared, for example, by introducing photopolymerisable groups into compounds which already contain several epoxide groups or by introducing at least one epoxide group into compounds having one or more photopolymerisable groups. Thus, for example, it is possible to react diepoxides with a less than equivalent amount, relative to the content of epoxide groups, of a compound containing both a photopolymerisable group and a functional group capable of reacting with epoxide groups, such as a carboxyl group, NH group or a phenolic or alcoholic hydroxyl group.

Doubly-functional substances of this type are described, for example, in U.S. Pat. No. 3,450,613 and in German Offenlegungsschriften Nos. 2,342,407 and 2,706,649. Preferred substances are acrylic-substituted carboxylic acids of the formula (b) indicated above, and also hydroxyl-substituted chalcones and hydroxyphenyl-substituted propenones or pentadienones, such as 1-(4-hydroxyphenyl)-3-oxo-3-phenylprop-1-ene, 1-(4-hydroxyphenyl)-1-oxo-3-phenylprop-2-ene and 1-(2-furyl)-3-oxo-3-(4-hydroxyphenyl)-prop-1-ene. Preferred doubly-functional substances are reaction products formed from one of the preferred diglycidyl ethers mentioned above, particularly the diglycidyl ether of bisphenol A, tetrabromobisphenol A or bisphenol F or the tetraglycidylated 4,4'-diaminodiphenylmethane, and a less than equivalent amount of acrylic acid or methacrylic acid.

The doubly-functional substances are usually employed in an amount of 10 to 70 mole %, relative to the total amount of epoxide resin (a), but at the most in an amount such that the equivalence ratio of epoxide groups to the photopolymerisable groups does not exceed 1:0.7.

The photopolymerisable compound (b) is preferably irradiated in the presence of a photopolymerisation catalyst (d). Two classes of compounds are suitable:

those which, on irradiation, yield an activated state which results in the formation of free radicals which then initiate the polymerisation of the monomer (photoinitiators) and those which, on irradiation, yield an activated state which in turn transfers its activation energy to a monomer molecule, so that an activated monomer molecule is formed which then undergoes crosslinking with a non-activated monomer molecule (photosensitisors). Suitable catalysts are described in German Offenlegungsschrift No. 2,706,549, which has already been mentioned. In general, 0.1 to 20% by weight, preferably 0.5 to 15% by weight, of photopolymerisation catalyst are used, relative to the total weight of the photopolymerisable compound and, if appropriate, the doubly-functional substance. Benzil dimethyl ketal is preferably used as the photopolymerisation catalyst.

Customary initiators, such as peroxides (for example dibenzoyl peroxide) or azoisobutyronitrile or pinacol derivatives, can be added to bring about the thermal polymerisation of photopolymerisable compounds which have been insufficiently exposed to the actinic irradiation.

Further additives which can be used in the process according to the invention for the preparation of prepregs or reinforced composite materials are customary additives, such as thixotropic agents, thermoplastics, for example polyvinylformal, acrylate copolymers or so-called reactive liquid rubbers, such as acrylonitrile/butadiene copolymers having terminal COOH groups, fillers, such as glass or quartz powder and small glass beads, dyes or pigments, wetting assistants and flow control assistants. In doing so, care must be taken that these additives or a concentration thereof do not excessively impair the penetration of the actinic radiation.

Actinic radiation of a wavelength of 200–600 nm, particularly UV irradiation, is preferably used for the photopolymerisation. Suitable sources of actinic radiation are, inter alia, carbon arcs, mercury vapour lamps, metal halide vapour lamps, fluorescent tubes containing luminous substances which emit ultraviolet light, argon and xenon glow-discharge lamps, tungsten lamps and photographic floodlight lamps. The time required for the exposure of the photopolymerisable compounds can vary as a function of the amount of the compounds (a), (b), (c) and, if appropriate, (d) used, the nature of the light source and the distance of the latter from the impregnated material. After the photopolymerisation, the material must in any case still be heat-curable; for this reason the photopolymerisation is carried out at temperatures below those at which the hot-curing is carried out in the presence of the heat-activatable curing agent.

The temperatures and the duration of heating required for hot-curing, and also the amount of curing agent required, can be determined readily by preliminary tests. In general hot-curing is carried out at temperatures between 60° and 160° C., preferably 60° and 120° C., for 10 minutes to 2 hours.

The epoxide resin (a), the photopolymerisable compound (b), the heat-activatable curing agent (c) and, if appropriate, the photopolymerisation catalyst (d) and the doubly-functional substance which may be present are preferably applied in such a way that the prepreg contains altogether 20 to 80% by weight of the said components and 80 to 20% by weight of reinforcing material. It is particularly preferable to employ altogether 20 to 50% by weight of the said components and 80 to 50% by weight of reinforcing material.

Prepregs prepared in accordance with the invention can be in the form of, for example, sheeting or various shaped articles, such as impregnated fabrics, mats, non-wovens or hanks. The process according to the invention is particularly suitable for the production of reinforced composite materials in which short cycle times and mould dwell times are important, for example skis, tennis rackets, car body components and casings of various kinds.

In the examples which follow, the determination of pot life is carried out by the Tecam method as specified in British Standard 3532 (1967) using a TECAM ® gel timer instrument made by Techma Ltd., Cambridge. This test determines the time required for a piston moving up and down in a 100 g resin/curing agent mixture to be no longer able to move because of gelling of the composition (starting temperature 23° C.). A Colight M-218 apparatus with 400-watt lamps (made by Colight) is used for the exposure. The lamp distance is approx. 28 cm; the energy radiated is $2 \times 27$ mW/cm$^2$ at 380 nm, $2 \times 60$ mW/cm$^2$ at 400 nm and $2 \times 55$ mW/cm$^2$ at 420 nm. The flow is determined by compressing 2 pieces of prepreg, each side 50 mm long, for 5 minutes at 100° C. in a press at a pressure of 4 bar. The amount of resin which has exuded from the resulting laminate is either estimated visually or is weighed after being cut off along the edge of the laminate and is expressed as a % of the initial weight. The serviceability of a prepreg is usually determined on the basis of its flow. If the flow is too small, for example less than 10%, a prepreg can, as a rule, no longer be compressed to give a good laminate. The interlaminar shear strength (bending test on a short bar) is determined as specified in ASTM D 2344 at a distance between supports of $l = 5 \times$ thickness. The glass transition temperature is determined on a thermo-mechanical TMA 40 analyser made by Mettler AG. The load on the penetrating punch is 0.5N/mm$^2$ and the heating rate is 10° C./minute. Evaluation is carried out entirely automatically.

In the following examples, amine hydrogen equivalent is abbreviated to N-H equivalent.

EXAMPLE 1

A streak-free resin/curing agent mixture is prepared by stirring at room temperature 100 g of a diglycidyl ether of 2,2-bis-(4-hydroxyphenyl)-propane (bisphenol A) having an epoxide content of 5.3 equivalents/kg, 10 g of 1,1,1-trimethylolpropane trimethacrylate in which 0.1 g of benzil dimethyl ketal has been dissolved and 15 g of a curing agent mixture consisting of 28.6% by weight of N,N-dimethylamino-N'-(3-aminopropyl)-1,3-diaminopropane (0.15 N-H equivalent/epoxide equivalent) and 71.4% by weight of N,N-dimethylamino-N'-(2-cyanoethyl)-1,3-diaminopropane (0.13 N-H equivalent/epoxide equivalent). The viscosity of the mixture at 25° C. is 1160 mPa s, the working life at 25° C. before reaching a viscosity of 3000 mPa s is 52 minutes and the pot life by the Tecam method, 100 g at 23° C., is 235 minutes.

This resin/curing agent mixture is used to impregnate a glass fibre fabric (type 92,146 I 550 made by Interglas) at room temperature, and the fabric is exposed to UV radiation from a Colight M 218 apparatus for 0.5 minute. The resulting prepreg is very flexible at room temperature and is scarcely tacky. The shelf life of the prepreg until its flexibility disappears is 24 hours at room temperature or approx. 96 hours if stored in a refrigerator at 5°-12° C.

12 layers of the prepreg are stacked one on top of another and are compressed at a pressure of 4 bar at 100° C. for 20 minutes to give laminates. The system according to the invention exhibits a so-called slowed flow (viscosity at the temperature of compression within the range of a few Pa.s to 1000 Pa.s), which affords the advantage that the mould and the press are only slightly contaminated, because the resin exudes over the edges of the glass fabric for only 2-3 cm. The interlaminar shear strength is 56N/mm$^2$ and the glass transition temperature is 70° C.

EXAMPLES 2 AND 3

Glass fibre fabric is impregnated with the following resin/curing agent mixtures and converted into prepregs by the procedure described in Example 1:

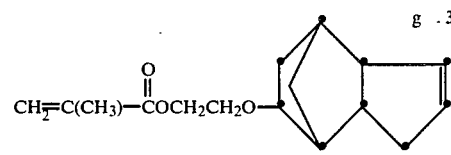

| Components | | Example 2 | Example 3 |
|---|---|---|---|
| Epoxide resin according to Example 1 | g | 100 | 100 |
| CH$_2$=C(CH$_3$)—COCH$_2$CH$_2$O— (structure above) | g | .30 | 8 |
| Ethylene glycol dimethacrylate | g | — | 2 |
| Benzil dimethylketal | g | 0.6 | 0.2 |
| Isophoronediamine (1 N—H equivalent/epoxide equivalent) | g | 22 | 22 |
| Exposure to UV | minutes | 13 | 3 |

Immediately after exposure to UV light, the prepregs thus obtained are still very flexible and markedly more tacky than the prepreg according to Example 1. After 3-4 hours storage at 25° C., the prepregs are no longer flexible and no longer tacky.

When compressed at 100° C./4 bar to give a laminate, the formulation according to Example 2 exhibits a considerably more pronounced slowed flow than the formulation according to Example 3, in that the resin now exudes only about 1-2 cm over the edges of the glass fabric. After the prepreg has been stored for 74 hours at room temperature, the flow is still adequate for the production of laminates.

EXAMPLE 4

In order to reduce the initial tackiness in comparison with the prepregs according to Examples 2 and 3 and to manage with the minimum amount of photopolymerisable compound, a mixture composed of the following components is prepared analogously to Example 1:

80 g of liquid epoxy resin based on bisphenol A having an epoxide content of 5.4 equivalents/kg, 20 g of solid epoxide resin based on tetrabromobisphenol A having an epoxide content of 2.0-2.2 equivalents/kg and a softening point between 40° and 60° C., 2 g of ethylene glycol dimethacrylate, 8 g of 2-hydroxyethyl methacrylate, 0.2 g of benzil dimethyl ketal and 20.1 g of isophoronediamine (1 N-H equivalent/epoxide equivalent). This mixture is used to impregnate a glass fibre fabric, which is irradiated with UV light for 4 minutes. Immediately after exposure the prepregs thus obtained are only slightly tacky. If stored in a refrigerator at 5°–10° C., this slight tackiness can be retained for approx. 24 hours. If stored at room temperature, the prepregs become dry to the touch after 3 hours. After 4 days' storage at room temperature, a laminate is produced as described in Example 1 from 12 layers of prepreg. A considerably slowed flow is then observed in the press (resin exudation: 1–2 cm). The resulting laminate is homogeneous and transparent.

EXAMPLE 5

A carbon fibre fabric (made by Sigri, weight per surface area 290 g/m$^2$) is impregnated at room temperature with a mixture consisting of: 75 g (0.40 epoxide equivalent) of liquid bisphenol A diglycidyl ether having an epoxide content of 5.3 equivalents/kg, 25 g (0.05 epoxide equivalent) of a solid bisphenol A diglycidyl ether having an epoxide content of 2.1 equivalents/kg, 11 g (0.074 C=C equivalent) of 2-hydroxypropyl methacrylate (Röhm & Haas, approx. 95% strength), 1.5 g (0.013 C=C equivalent) of 1,4-butanediol dimethylacrylate (Röhm & Haas, approx. 95% strength), 0.24 g of benzil dimethyl ketal, 8.6 g (0.23 N-H equivalent) of 1-phenyl-1,3-diaminopropane and 12.08 g (0.22 N-H equivalent) of bis-(p-aminocyclohexyl)-methane. After irradiation with UV light for 4 minutes between two covering sheets of polyethylene, a flexible, still slightly tacky prepreg is obtained, which is only slightly tacky after being stored for 2 hours at room temperature. The prepreg is dry after being stored for 12 hours at room temperature. After 3 days' storage at 23°–28° C., 2 layers of prepreg (each 1.6 mm thick) are compressed to give a laminated sheet. Compression conditions: 15 minutes at 100° C./10 bar, relative to the laminated sheet. A slowed flow is observed in the compression, i.e. the resin exudes approx. 1 cm over the edge of the laminate. In spite of the very short curing time at 100° C., the resin has a glass transition temperature of 96° C., measured on the exuded material.

EXAMPLE 6

Preparation of a prepreg for ski construction. A resin is prepared from the following components: 40 parts by weight of a liquid bisphenol A diglycidyl ether having an epoxide content of 5.3 equivalents/kg, 60 parts by weight of a solid bisphenol A diglycidyl ether having an epoxide content of 2.2 equivalents/kg, 20 parts by weight of 2-ethoxyethyl methacrylate, 0.4 part by weight of benzil dimethyl ketal and 0.5 part by weight of 3-glycidyloxypropyltrimethoxysilane.

This resin is kept so that light is excluded. Its viscosity is 16,600 mPa s at 25° C.

The curing agent used is a mixture of: 3 parts by weight of N,N-dimethyl-N'-(3-aminopropyl)-1,3-diaminopropane and 5 parts by weight of N,N-diethyl-1,3-diaminopropane.

100 parts by weight of the resin are mixed with 8 parts by weight of curing agent. The resulting mixture has a viscosity of 10,200 mPa s at 25° C. and a gel time of 6–7 minutes at 100° C.

A glass fabric 20 cm wide is impregnated by the dip tank method with this resin/curing agent mixture on a continuous impregnation machine having an impregnating bath holding approx. 500 ml. Immediately after the impregnation bath, the impregnated glass fabric is heated by infrared radiation in order to reduce the viscosity of the resin/curing agent mixture sufficiently for good wetting and thorough impregnation of the glass fabric to be effected.

The glass fabric is then irradiated on both sides with UV light (from 400-watt mercury vapour lamps) at a dwell time of 2 minutes in the irradiation zone. The result of the UV irradiation is to solidify the prepreg, in that it is initially still slightly tacky, but after 10 minutes is already dry to the touch and stiff. Its shelf life is 2 to 3 days at room temperature.

This prepreg is used for ski construction. Its adhesion is very good after it has been compressed for 10 minutes at 100° C. with a very wide range of materials used in ski construction. [Examples of such materials are: aluminium, polyurethane integral foam, acrylonitrile-/butadiene/styrene copolymer (ABS), pretreated polyethylene, ash, poplar and okumé wood, rubber and phenol-formaldehyde laminate.]

The bonded materials have the following properties:

The tensile shear strength of the test specimen composed of prepreg and ground aluminium is 15.8N/mm$^2$.

The peel strength of bonded materials is tested as specified in DIN 53,289 on test specimens 2.5 cm wide. The results are listed in the following table.

TABLE

| Bonded material | Peel strength N/mm |
|---|---|
| Aluminium; ground | 2.54 ± 0.54 |
| Ash/poplar; glued ski core | 1.36 ± 1.0 |
| ABS surface sheet; ground | 2.04 ± 0.40 |
| Polyethylene; pretreated | polyethylene fracture |
| Rubber; acid-etched | 1.95 ± 0.32 |
| Phenol-formaldehyde laminate | moderate to good |
| Polyurethane integral foam | 1.7 ± 0.7 |

What is claimed is:

1. A process for the preparation of prepregs comprising the steps of
   (i) impregnating a reinforcing material with a liquid, solvent-free composition containing
      (a) an epoxide resin having on averaage more than one oxirane group,
      (b) a non-epoxide containing photopolymerizable acrylic ester having at least one group of the formula CH$_2$=C(Q$_3$)COO— wherein Q$_3$ is a hydrogen, chlorine or bromine atom or C$_1$–C$_4$ alkyl,
      (c) a heat-activable curing agent for component (a) selected from the group consisting of [tetramethylenediamine, hexamethylenediamine, polyethylenediamine H$_2$N—CH$_2$—CH$_2$(N-H—CH$_2$CH$_2$)$_b$—NH$_2$ in which b=1–6,]1,2-, 1,3- and 1,4-diaminocyclopentane, 1,2-diaminocyclohexane, 1,3-diaminocyclohexane, 1,4-diaminocyclohexane, 1,3-bis-(aminomethyl)-cyclohexane, 1,4-bis-(aminoethyl)-cyclohexane, 3,3'-, 3,4'- and 4,4'-diaminodicyclohexylmethane, [1,3-xylylenediamine, 1,4-xylylenediamine, N-ethylaminopiperazine,]3-amino-methyl-3,5,5-trimethylcyclohexylamine(isophoronediamine), [N,N-dimethyl-N'(3-aminopropyl)-1,3-diaminopropane]3(4), 8(9)-bisaminomethyltricyclo(5.2.10$^2$.6)decane and mixtures thereof, and
      (d) a photopolymerization catalyst for compound (b);
   (ii) exposing said impregnated material to actinic radiation until said composition solidified to give a substantially solid layer as a result of the photopolymerization of acrylic ester (b), whereas the epoxide resin remains substantially in a heat-curable state; and (iii) heating said solidified composition to temperatures from 60° to 120° C. within a time interval from 10 to 120 minutes to effect curing of the epoxide resin; said epoxide resin (a) and photopolymerizable acrylic ester (b) being present in a weight ratio of 100:3 to 100:30 such that, after irradiation with actinic light, the composition can still be shaped by thermoplastic methods.

2. The process according to claim 1, wherein said weight ratio of epoxide resin (a) and photopolymerizable acrylic ester (b) is 100:6 to 100:20.

3. A process according to claim 1, wherein the reinforcing material used is glass, boron, stainless steel, tungsten, silicon carbide, carbon or aromatic polyamide fibres.

4. A process according to claim 1, wherein glass fibres are used as the reinforcing material.

5. A process according to claim 1, wherein an epoxide resin which contains groups of the formula A

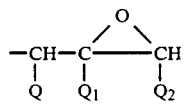
(A)

attached to carbon, oxygen, nitrogen or sulfur atoms and which is free from acryloyl or methacryloyl groups, Q and $Q_2$ each being a hydrogen atom and $Q_1$ being a hydrogen atom or the methyl group or Q and $Q_2$ together being —CH$_2$CH$_2$— or —CH$_2$CH$_2$CH$_2$— and $Q_1$ being a hydrogen atom, is used.

6. A process according to claim 1, wherein diglycidyl ethers, which may be advanced, of dihydric phenols or dihydric aliphatic alcohols having up to 8 C atoms, poly-glycidyl ethers of novolacs or tetraglycidylated 4,4'-diaminodiphenylmethane are used as the epoxide resin (a).

7. A process according to claim 1, wherein diglycidyl ethers, which may be advanced, of bisphenol A, tetrabromobisphenol A or bisphenol F, tetraglycidylated 4,4'-diaminodiphenylmethane or polyglycidyl ethers of phenolformaldehyde or cresol-formaldehyde novolacs, or mixtures thereof are used as the epoxide resin (a).

8. A process according to claim 1, wherein the photopolymerisable compound (b) is an acrylic acid ester of the formula D, E, F or G

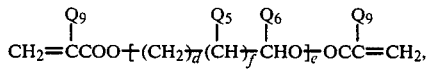
(D)

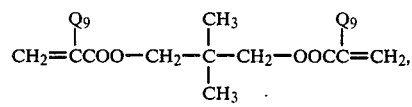
(E)

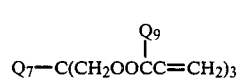
(F)

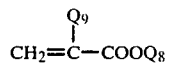
(G)

in which d is an integer from 1 to 8, e is an integer from 1 to 20, f is zero or 1, $Q_5$ is —H, —OH or —OOCC($Q_9$)=CH$_2$, $Q_6$ is —H, methyl, ethyl, —CH$_2$OH or —CH$_2$OOCC($Q_9$)=CH$_2$, $Q_7$ is methyl, ethyl, —CH$_2$OOCC($Q_9$)=CH$_2$ or CH$_2$—OH, $Q_8$ is $C_{1-18}$-alkyl, hydroxyalkyl having 1-6 C atoms, alkoxyalkyl having a total of 2-8 C atoms, a group

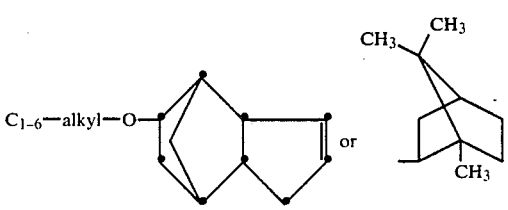

N,N-dialkylaminoalkyl having a total of 3-12,

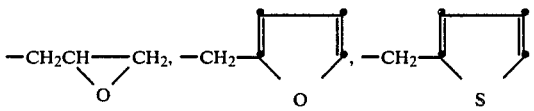

$C_{3-4}$-alkenyl, cyclopentyl or cyclohexyl and $Q_9$ is hydrogen or methyl.

9. The process according to claim 1, wherein the photopolymerisable acrylic ester (b) is ethylene glycol dimethacrylate, 1,4-butanediol dimethacrylate, 2-hydroxyethyl methacrylate, 2-hydroxypropyl methacrylate, 2-ethoxyethyl methacrylate, 1,1,1-trimethylolpropane trimethylacrylate or

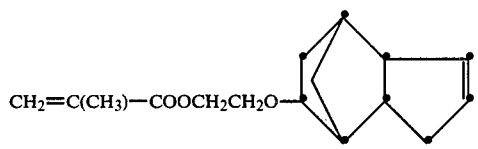

or mixtures of the said compounds.

10. A process according to claim 1, wherein said liquid composition additionally contains a doubly-functional reaction product formed from a diglycidyl ether of bisphenol A, tetrabromobisphenol A or bisphenol F or from tetraglycidylated 4,4'-diaminodiphenylmethane and a less than equivalent amount of acrylic acid or methacrylic acid.

11. A prepreg obtained by the process according to claim 1.

12. A process for the preparation of reinforced composite materials, which comprises hot-curing prepregs which have been prepared in accordance with claim 1.

* * * * *